(12) United States Patent
Lal et al.

(10) Patent No.: US 6,858,888 B2
(45) Date of Patent: Feb. 22, 2005

(54) STRESS CONTROL OF SEMICONDUCTOR MICROSTRUCTURES FOR THIN FILM GROWTH

(75) Inventors: Amit Lal, Ithaca, NY (US); Max G. Lagally, Madison, WI (US); Chung Hoon Lee, Ithaca, NY (US); Paul Powell Rugheimer, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 10/302,777

(22) Filed: Nov. 22, 2002

(65) Prior Publication Data

US 2003/0168659 A1 Sep. 11, 2003

Related U.S. Application Data

(60) Provisional application No. 60/333,331, filed on Nov. 26, 2001.

(51) Int. Cl.[7] .......................... H01L 29/80; H01L 31/112
(52) U.S. Cl. ........................... 257/276; 257/12; 257/14; 257/99; 257/414
(58) Field of Search .............................. 257/12, 14, 99, 257/414, 276

(56) References Cited

U.S. PATENT DOCUMENTS

| 4,744,863 | A | | 5/1988 | Guckel et al. | |
|---|---|---|---|---|---|
| 5,164,339 | A | * | 11/1992 | Gimpelson | 438/52 |
| 5,198,390 | A | * | 3/1993 | MacDonald et al. | 438/52 |
| 5,369,280 | A | * | 11/1994 | Liddiard | 250/370.08 |
| 5,562,770 | A | | 10/1996 | Chen et al. | 438/202 |
| 5,614,435 | A | | 3/1997 | Petroff et al. | |
| 5,683,591 | A | * | 11/1997 | Offenberg | 216/2 |
| 5,786,235 | A | * | 7/1998 | Eisele et al. | 438/53 |
| 5,895,851 | A | * | 4/1999 | Kano et al. | 73/504.04 |
| 5,922,212 | A | | 7/1999 | Kano et al. | 216/2 |
| 5,936,159 | A | * | 8/1999 | Kano et al. | 73/514.36 |
| 6,056,888 | A | | 5/2000 | August | |
| 6,087,747 | A | * | 7/2000 | Dhuler et al. | 310/90 |
| 6,180,428 | B1 | * | 1/2001 | Peeters et al. | 438/22 |
| 6,211,056 | B1 | * | 4/2001 | Begley et al. | 438/619 |
| 6,215,645 | B1 | * | 4/2001 | Li et al. | 361/283.3 |
| 6,218,911 | B1 | * | 4/2001 | Kong et al. | 333/101 |
| 6,241,906 | B1 | * | 6/2001 | Silverbrook | 216/27 |
| 6,257,739 | B1 | | 7/2001 | Sun et al. | |
| 6,373,632 | B1 | * | 4/2002 | Flanders | 359/578 |
| 6,617,657 | B1 | * | 9/2003 | Yao et al. | 257/415 |
| 2001/0044165 | A1 | * | 11/2001 | Lee et al. | 438/52 |
| 2001/0055833 | A1 | * | 12/2001 | Fiorini et al. | 438/94 |
| 2002/0045297 | A1 | * | 4/2002 | Leedy | 438/149 |
| 2003/0043444 | A1 | * | 3/2003 | Christenson | 359/231 |
| 2003/0052271 | A1 | * | 3/2003 | Fedder et al. | 250/338.4 |

* cited by examiner

Primary Examiner—Amir Zarabian
Assistant Examiner—Ida M. Soward
(74) Attorney, Agent, or Firm—Foley & Lardner LLP

(57) ABSTRACT

A suspended semiconductor film is anchored to a substrate at at least two opposed anchor positions, and film segments are deposited on the semiconductor film adjacent to one or more of the anchor positions to apply either tensile or compressive stress to the semiconductor film between the film segments. A crystalline silicon film may be anchored to the substrate and have tensile stress applied thereto to reduce the lattice mismatch between the silicon and a silicon-germanium layer deposited onto the silicon film. By controlling the level of stress in the silicon film, the size, density and distribution of quantum dots formed in a high germanium content silicon-germanium film deposited on the silicon film can be controlled.

20 Claims, 9 Drawing Sheets

STRESS CONTROL OF SEMICONDUCTOR MICROSTRUCTURES FOR THIN FILM GROWTH

CROSS-REFERENCE TO RELATED APPLICATION

This application claims the benefit of provisional application Ser. No. 60/333,331, filed Nov. 26, 2001, the disclosure of which is incorporated herein by reference.

REFERENCE TO GOVERNMENT RIGHTS

This invention was made with United States government support awarded by the following agency: NSF 0079983. The United States government has certain rights in this invention.

FIELD OF THE INVENTION

This invention pertains generally to the field of semiconductor processing and particularly to the growth of thin films of semiconductor in a controlled manner.

BACKGROUND OF THE INVENTION

Significant improvements in the functionality of integrated circuits may be obtained by integrating different materials with specialized properties onto a base semiconductor such as crystalline silicon. For example, semiconductor structures incorporating thin films of gallium nitride, germanium, germanium-silicon, etc. on a silicon base would enable the development of transistors with integrated optics capabilities or the capability of operation at much higher frequencies than presently possible. A major obstacle to growing thin films of one semiconductor material on another (such as germanium on silicon) is the lattice mismatch and consequent strain-induced film morphology. This obstacle controls and limits the film morphology and, in turn, the electrical and optical properties of the film.

Strain induced thin film morphology limitations are encountered, for example, in the heteroepitaxial growth of silicon-germanium on crystalline silicon substrates. It is found that heteroepitaxial growth of $Si_{1-x}Ge_x$ with x>0.2 typically results in the formation of three-dimensional islands which can act as quantum dots (QDs) because they localize charge. These coherently strained QDs form naturally as a strain reduction mechanism for the film. If x is less than 0.2, a strained film is formed which does not have the 3D islands. Heterojunction bipolar transistors (HBTs) have been made using such defect-free epitaxial films of silicon-germanium and have shown dramatically improved performance relative to silicon HBTs. However, it would be desirable to be able to increase the germanium concentration in such films beyond that which has been possible in the prior art because of the occurrence of the quantum dot islands at higher germanium concentrations. In addition, the thickness of a heteroepitaxial silicon-germanium film of a given germanium concentration is limited by the critical thickness at which dislocations form because of the 4.2% lattice mismatch. While it would be desirable to be able to produce thicker defect-free films for many applications such as HBTs, for certain applications, the quantum dots that are formed in strained films are desirable because of potential applications in quantum computation and communication, light detectors, and lasers. It would be preferable for many of these applications that the arrangement of quantum dots be regular, rather than random, and with a narrow quantum dot size distribution.

SUMMARY OF THE INVENTION

The micromachined structures of the present invention provide a selected surface stress level in a semiconductor film, such as silicon, that allows the growth of an epitaxial film on the semiconductor film in a controlled manner to result in desired properties. Such structures can be produced by lithography and scaled to sub-micron dimensions. Parallel batch fabrication of multiple devices on a silicon wafer can be carried out with subsequent dicing of the structures after fabrication of transistors or other devices.

In the present invention, a biaxial or uniaxial tensile or compressive stress is applied to a suspended semiconductor film (e.g., crystalline silicon) and a heteroepitaxial film of semiconductor material is grown on the stressed semiconductor film. The stress in the base semiconductor film is introduced by utilizing thin film segments deposited on the semiconductor film which have strain with respect to the semiconductor film as deposited, applying either tensile or compressive stress to the semiconductor film. Utilizing the induced stress on the semiconductor film, the natural lattice mismatch strain and/or thermal expansion strain can be enhanced or countered, as desired, allowing growth morphologies to be controlled to allow applications such as the production of specific arrays of quantum dots, high germanium concentration films, and arrays of quantum dots with controlled size distributions.

The semiconductor microstructures of the invention include a suspended semiconductor film anchored to a substrate at at least two opposed anchor positions, and strain inducing thin film segments deposited on the semiconductor film adjacent to the anchor positions to apply either compressive or tensile stress to the semiconductor film between the film segments. Crystalline silicon may be utilized as the semiconductor film, although it is understood that other semiconductors (e.g., germanium, gallium arsenide, etc.), or other forms of the semiconductor (e.g., polycrystalline silicon) may constitute the semiconductor film. For silicon thin films, the film segments may comprise layers of, e.g., silicon dioxide and silicon nitride which are particularly suited to apply tensile stress to the semiconductor film. The semiconductor film may be formed as a beam which is anchored to the substrate at two opposed positions and is suspended from the substrate between the two opposed anchor positions. The semiconductor film may also be formed with arms anchored to the substrate at multiple pairs of opposed anchor positions to apply stress in multiple directions to a central portion of the semiconductor film. A layer of material such as silicon-germanium may be deposited on the central region of the semiconductor film, with the characteristics of the deposited layer affected by the stress in the underlying semiconductor film. For example, in accordance with the invention, the number of quantum dots in silicon-germanium deposited on a silicon semiconductor film is inversely related to the tensile stress imposed on the underlying semiconductor film.

The semiconductor microstructures in accordance with the invention may be formed by providing a semiconductor structure including at least a layer of semiconductor film over a sacrificial layer, with the semiconductor film secured to a substrate. A film of material is then deposited over the semiconductor film that is in tensile or compressive strain with respect to the semiconductor film. The deposited film is patterned to leave opposed segments spaced from each other by a central region of the semiconductor film. The semiconductor film is then patterned and the sacrificial layer is removed beneath the patterned semiconductor film to leave a semiconductor film section anchored to the substrate at opposed anchor positions. The film segments remain on the semiconductor film adjacent to the anchor positions and spaced from each other by the central region of the suspended semiconductor film such that the film segments apply a tensile or compressive stress to the suspended semiconductor film.

Further objects, features and advantages of the invention will be apparent from the following detailed description when taken in conjunction with the accompanying drawings.

DETAILED DESCRIPTION OF THE INVENTION

Figure 1:
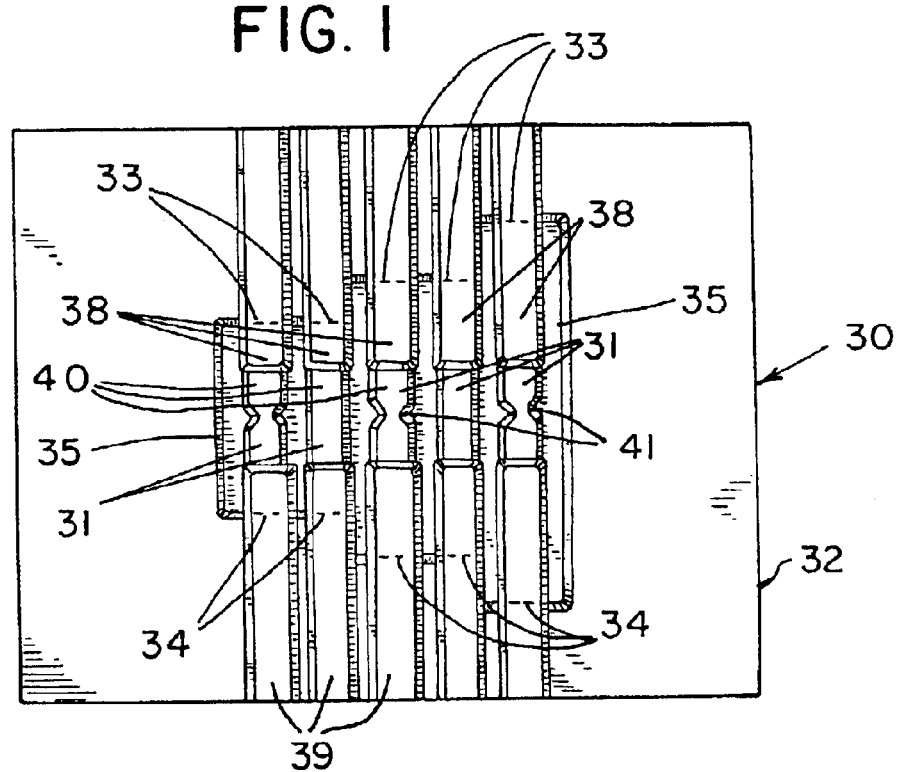
FIG. 1 is a plan view of multiple semiconductor microstructures in accordance with the invention having a semiconductor film anchored to the substrate at two opposed anchor positions.

With reference to FIG. 1, an example of the invention in which the semiconductor film is formed as a beam anchored at two ends to form a bridge is illustrated generally at 30. A plurality of different semiconductor film bridge beams 31 of various lengths and configurations are shown. Each of the semiconductor film beams 31 is anchored to a substrate 32 at opposed anchor positions 33 and 34. The anchored beams 31 are suspended over an opening or depression 35 in the substrate. Thin film segments 38 and 39 are deposited on the semiconductor film beams 31 adjacent to the anchor positions 33 and 34, respectively. As illustrated in FIG. 1, the thin film segments 38 and 39 may be deposited both over a portion of the suspended beam 31 as well as over the surface of the substrate 32. The film segments 38 and 39 are spaced from each other to leave a central position 40 of each of the beams 31 that is not covered by the films 38 and 39 and which is available to be used for other purposes, e.g., formation of devices thereon, and particularly for the deposit of a heteroepitaxial film of another semiconductor. The deposited film segments 38 and 39 have a strain as deposited on the semiconductor film beams 31 to apply either compressive or tensile stress to the beams 31. Commonly, the film segments 38 and 39 will be deposited to provide tensile strain, thereby applying tensile stress to the thin film beams 31, with the tensile stress induced in a direction parallel to the length of the beams 31. The stress in the beams may be concentrated by utilizing notches or cutouts as illustrated at 41 in FIG. 1 or by forming openings (not shown) in the beams.

Figure 2:
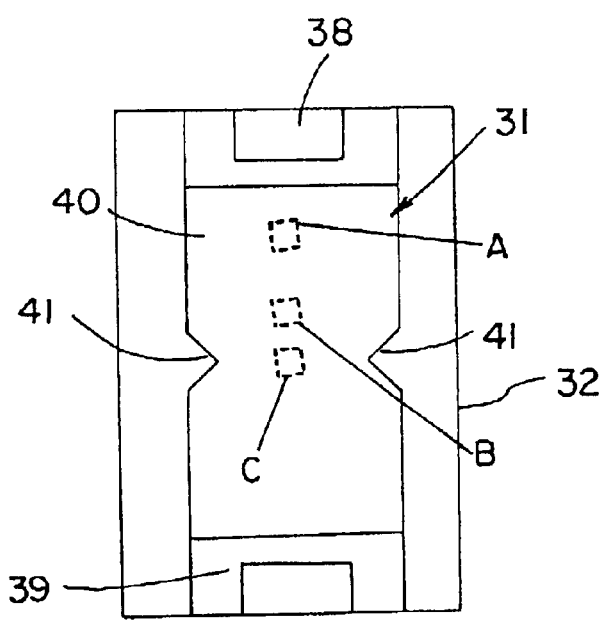
FIG. 2 is a more detailed plan view of a portion of a suspended semiconductor film having notches formed therein to provide stress concentration.
Figure 3:
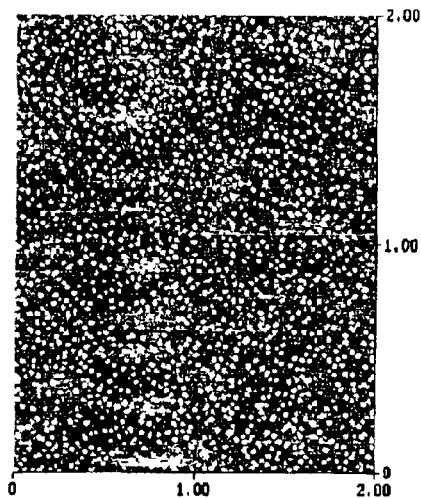
FIG. 3 is a photomicrograph illustrating formation of quantum dots in a silicon-germanium layer deposited on the microstructure of FIG. 2 at a low stress position.
Figure 4:
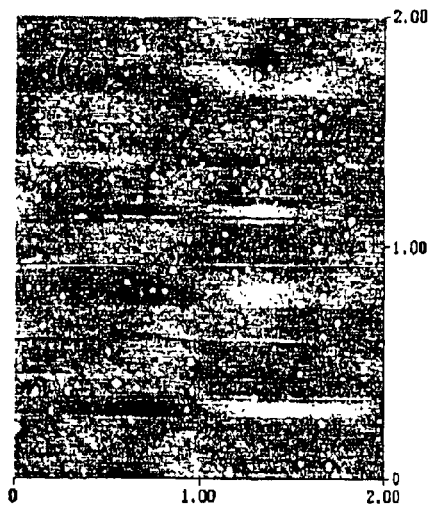
FIG. 4 is a photomicrograph as in FIG. 3 illustrating the formation of quantum dots in the deposited layer surface at an intermediate stress position.
Figure 5:
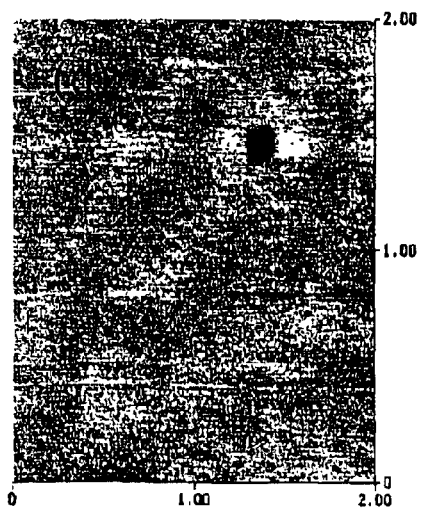
FIG. 5 is a photomicrograph as in FIG. 3 illustrating the layer surface at a highly strained position.
Figure 6:
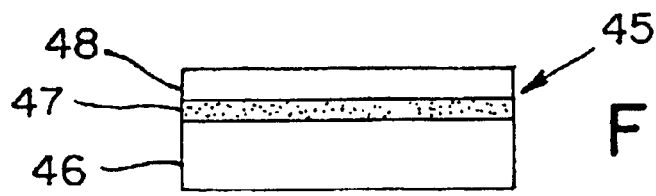
FIG. 6 is an illustrative side view of a silicon-on-insulator structure that may be utilized in forming semiconductor microstructures in accordance with the invention.

FIG. 2 illustrates an example of the beam structure of FIG. 1 having notches 41 therein for concentration of stress. An exemplary structure of this type was formed, as described further below, to provide a crystalline silicon thin film bridge 31 and deposited film segments 38 and 39 formed of layers of silicon dioxide and silicon nitride. A layer of silicon-germanium was then deposited on the central portion 40 of the beam and annealed. Atomic force microscope images taken from the position marked A, B and C in FIG. 2 are shown in FIG. 3, FIG. 4, and FIG. 5, respectively. Due to the shape of the bridge structure, the highest strain occurs near the notches 41 at the position C and the lowest strain occurs near the deposited film segments 38 and 39, such as at the position marked A in FIG. 2. FIG. 3, taken from the position marked A in FIG. 2, shows a quantum dot morphology similar to that which would be seen for silicon-germanium growth on an unstrained silicon substrate. FIG. 4, at an area of greater tensile stress in the beam 31, shows a significant decrease in the density of quantum dots, indicating that coarsening throughout the anneal period has resulted in a lower density of small quantum dots. In the image of FIG. 5, from the highest stress area of the beam, the density of small quantum dots is extremely low (none are visible in the scan area; the black spot is a minor defect in the silicon buffer layer).

Figure 7:
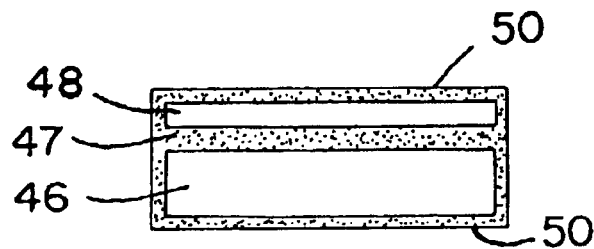
FIG. 7 is a view as in FIG. 6 at a further processing step.
Figure 8:
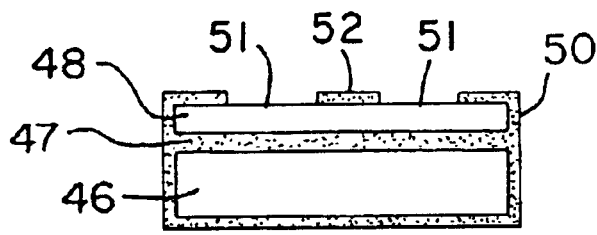
FIG. 8 is a view as in FIG. 7 after a further processing step.
Figure 9:
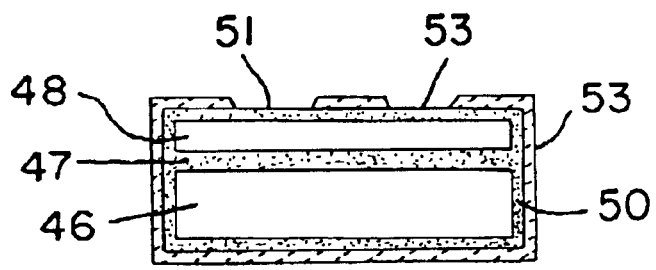
FIG. 9 is a view as in FIG. 8 after a further processing step.
Figure 10:
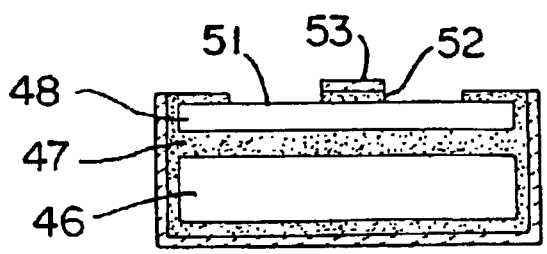
FIG. 10 is a view as in FIG. 9 after a further processing step.
Figure 11:
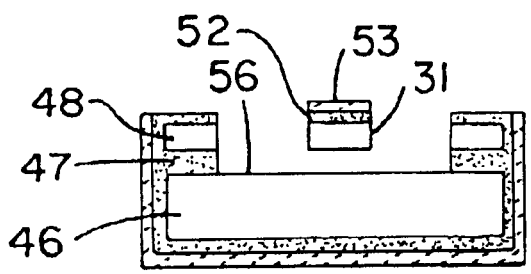
FIG. 11 is a view as in FIG. 10 after a final processing step leaving a suspended semiconductor film with film segments thereon.

An exemplary process for forming the stressed thin film structures of the invention is illustrated with respect to FIGS. 6–11. In this exemplary process, the device fabrication begins with a commercial silicon-on-insulator wafer 45 composed of a base substrate layer of crystalline silicon 46, a silicon dioxide layer 47, and a top crystalline silicon layer 48, (e.g., a 4 inch<100>SOI (Si/SiO$_2$/Si=10/1/550 $\mu$m). The wafer 45 is initially oxidized with a 0.8 $\mu$m thermal oxide (at 1050° C.) coating 50 as shown in FIG. 7. The oxide coating 50 serves to protect silicon areas where quantum dot growth occurs after micromechanical or microelectronic structures are fabricated. The oxide layer on the front side of the wafer is then etched to form openings 51 and to leave a central oxide layer 52 at positions at which the thin film segments are to be formed, as shown in FIG. 8, and a layer 53 of silicon nitride is then deposited over the wafer including the open areas 51, as shown in FIG. 9. The front side silicon nitride layers are then removed by deep reactive ion etching (RIE (UW-STS)) to open the areas 51 leaving the silicon dioxide layer 52 and the silicon nitride layer 53 as the thin film segments over the silicon layer 48, as shown in FIG. 10. RIE etching of the silicon layer 48 is followed by etching of the buried oxide layer 47, acting as a sacrificial layer, e.g., by HF:HCl (1:1), as illustrated in FIG. 11, to release a suspended silicon beam 31 formed from the silicon layer 48. The overlying film segments composed of the layers 52 and 53 have built-in strain to stress the suspended beam 31 in, e.g., tensile, stress. As illustrated in FIG. 11, the thin film beam 31 is suspended above a surface 56 of the base substrate 46 in the area of the opening 58 which was opened by the etching processes. It is understood that the beam 31 is anchored at opposed anchor positions to the silicon substrate 46 by the oxide layer 47 and the silicon layer 48 (which, in this case, is integral with the silicon beam 31).

Figure 12:
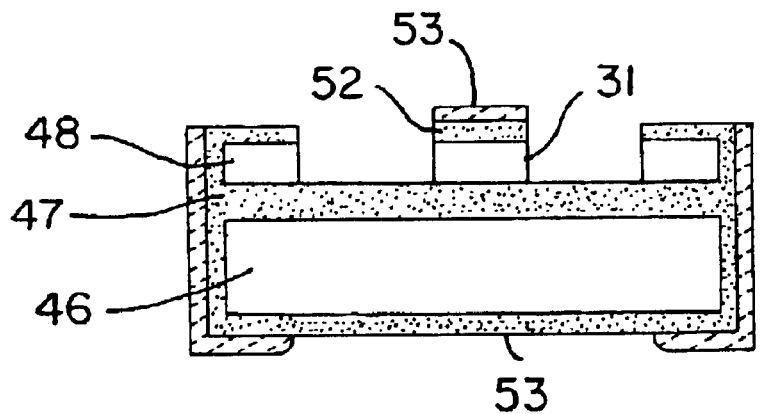
FIG. 12 is a view similar to that of FIG. 9 after an alternative processing step.
Figure 13:
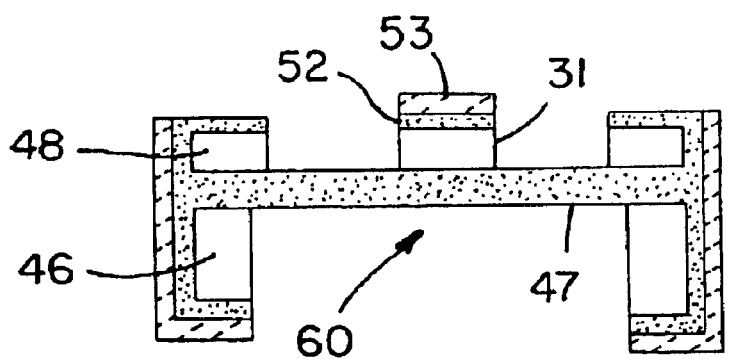
FIG. 13 is a view as in FIG. 12 after a further processing step.
Figure 14:
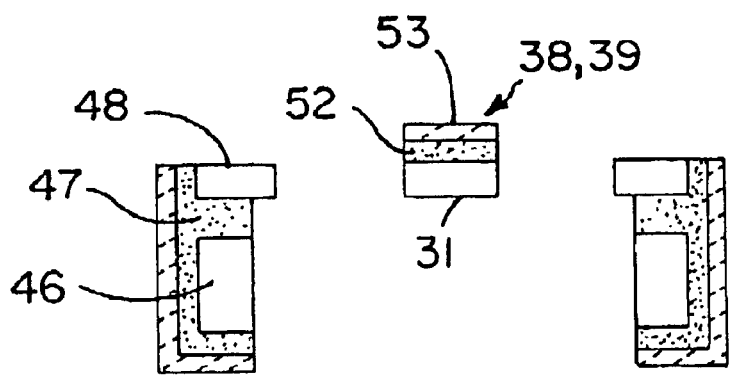
FIG. 14 is a view as in FIG. 13 after a final processing step leaving the suspended semiconductor film with film segments thereon.

An alternative procedure for freeing the beam is illustrated with respect to FIGS. 12–14. With the front side silicon nitride layer removed, as was shown in FIG. 10, an RIE etching is carried out through the oxide layer 48 to isolate the thin film beam 31 on the oxide layer 47, as shown in FIG. 12. The backside silicon nitride layer 53 is then removed, e.g., by RIE, followed by a backside etching of the substrate silicon layer 46 that terminates on the oxide layer 47 to leave an opening 60 in the backside of the wafer, as shown in FIG. 13. The oxide layer 47 in the exposed area 60 is then etched away to release the beam 31 with the thin film segments 33 or 34, composed of the layers 52 and 53, over portions of the beam 31.

Figure 15:
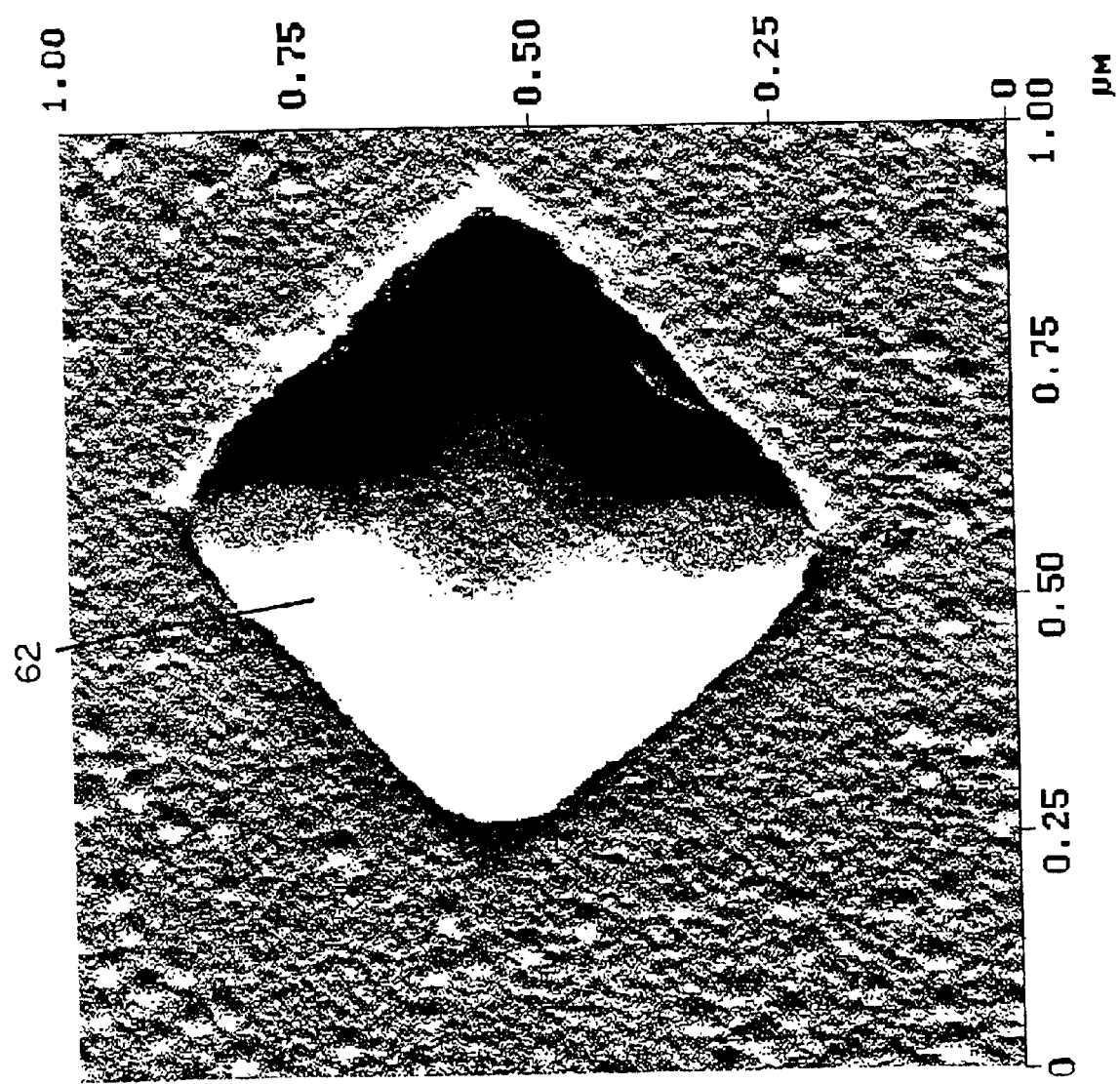
FIG. 15 is a photomicrograph showing a large quantum dot formed in the deposited layer at a high stress area of the semiconductor structure as in FIG. 2.
Figure 16:
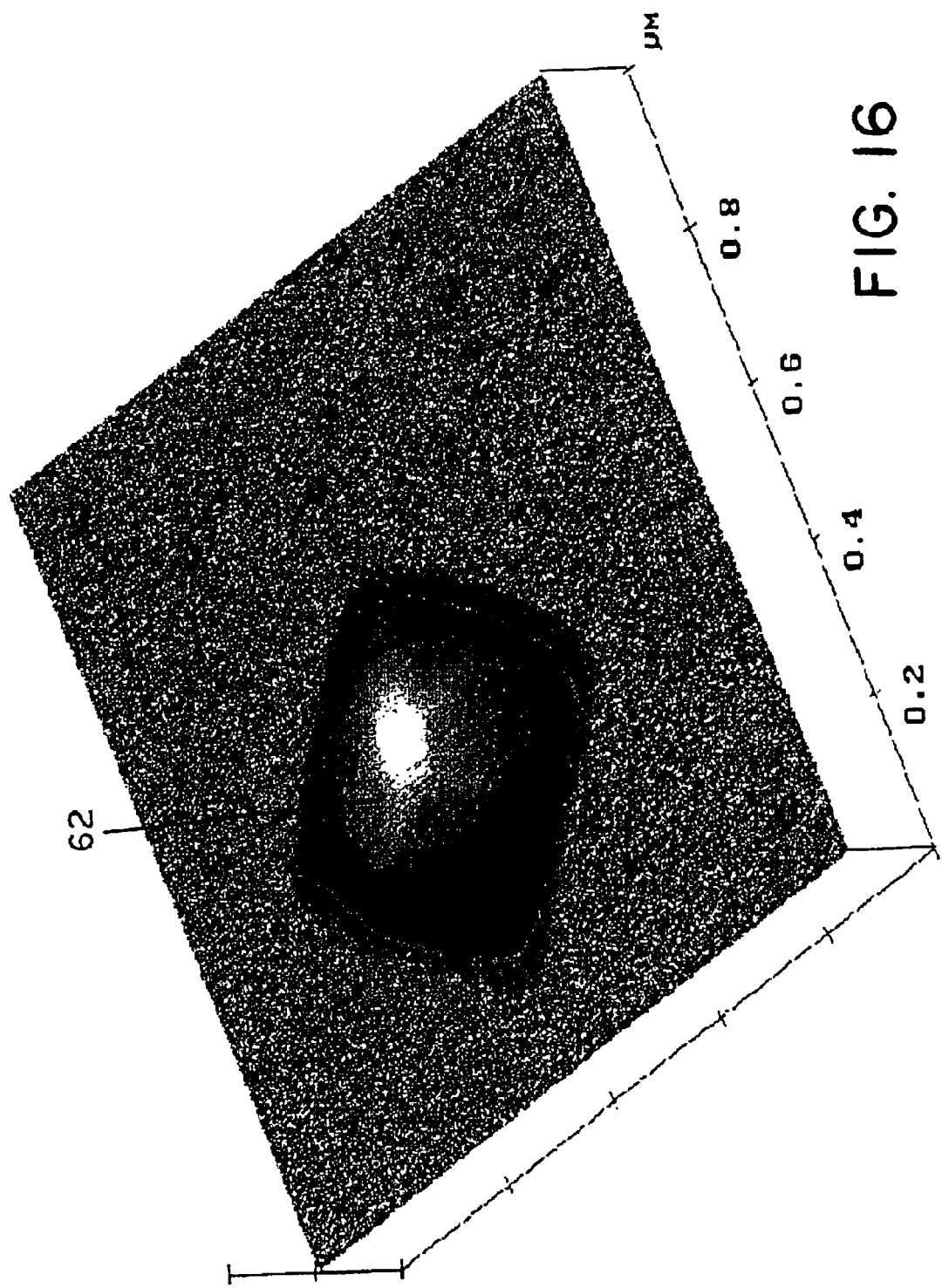
FIG. 16 is a photomicrograph illustrating a perspective view of a large quantum dot as in FIG. 15.

After patterning and releasing of the stressed suspended silicon film beams 31, a thin film of another semiconductor may be deposited on the stressed films 31. For example, silicon-germanium films may be grown on the stressed films 31. As an example, silicon-germanium films at various silicon to germanium ratios were formed on the film beams 31 of FIG. 1. After these beams were patterned and released, they were chemically cleaned and loaded into a UHV Molecular Beam Epitaxy (MBE) chamber where growths of Si Ge were performed between 450° C. and 550° C. At a high flux rate of Ge, the film growth is kinetically limited, which causes a high density of small quantum dots (less than 30 nm) to form, regardless of the stress on the beams 31. By subjecting the samples to a 30 minute post-growth anneal at the growth temperature, however, clear differences in morphology on the strained and unstrained areas of the substrate were found. FIGS. 3–5, discussed above, illustrate a density gradient of small quantum dots which is inversely proportional to the underlying substrate strain. Following a 30 minute anneal at the growth temperature of 550° C., a few extremely large islands (about 0.5 $\mu$m) were found, as illustrated in FIGS. 15 and 16. As shown in FIG. 15, small quantum dot islands were seen surrounding the large island denoted at 62 in FIGS. 15 and 16. In the highly strained areas of the silicon beam, the densities of these large islands is as much as 50 times greater than in the unstrained areas. The lower density of small quantum dots seen in FIGS. 4 and 5 can be attributed to the relatively high density of nearby large islands.

Figure 17:
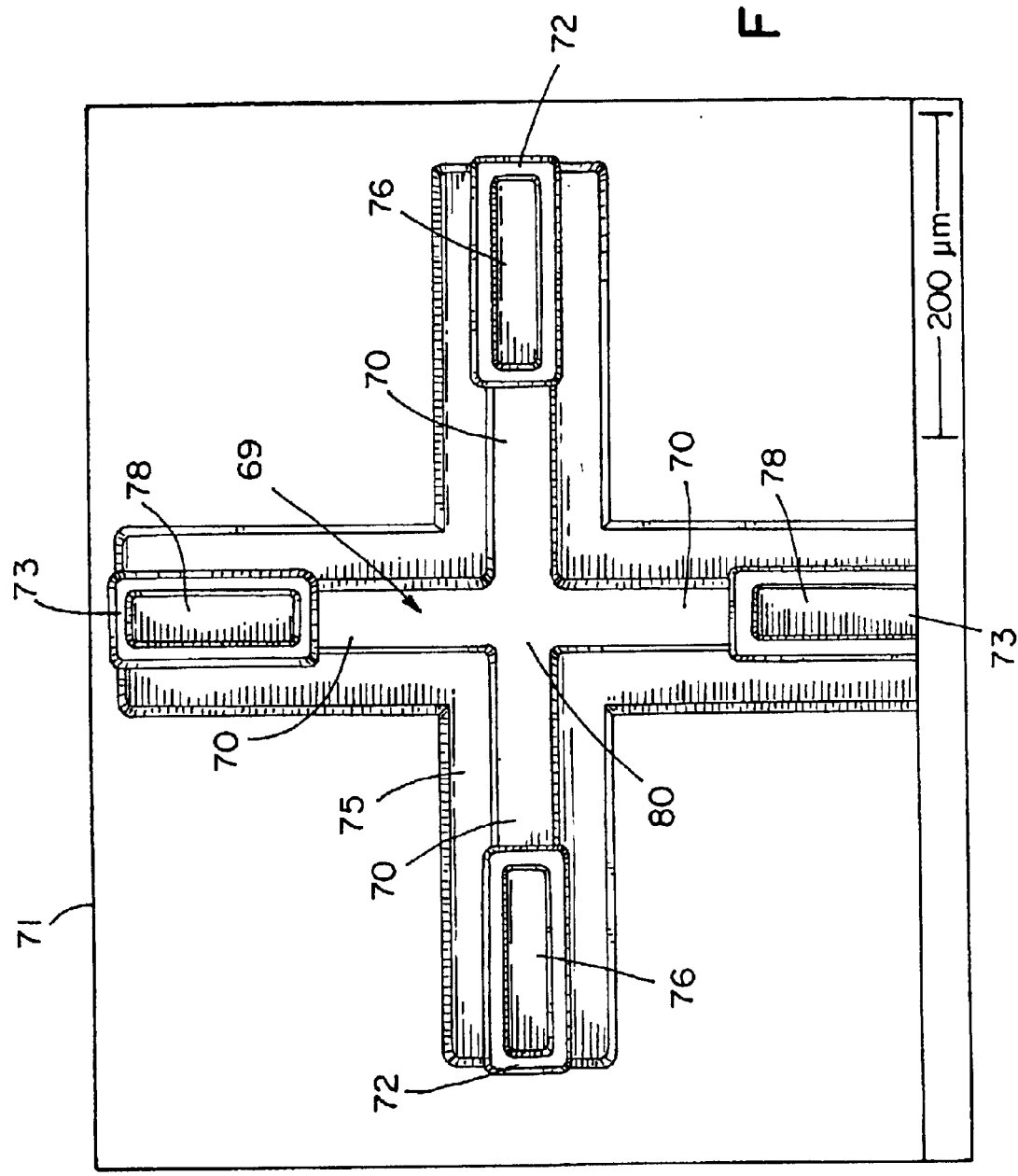
FIG. 17 is a plan view of another semiconductor microstructure in accordance with the invention having a semiconductor film with arms anchored to the substrate at two pairs of opposed anchor positions that are diagonally oriented with respect to each other.
Figure 18:
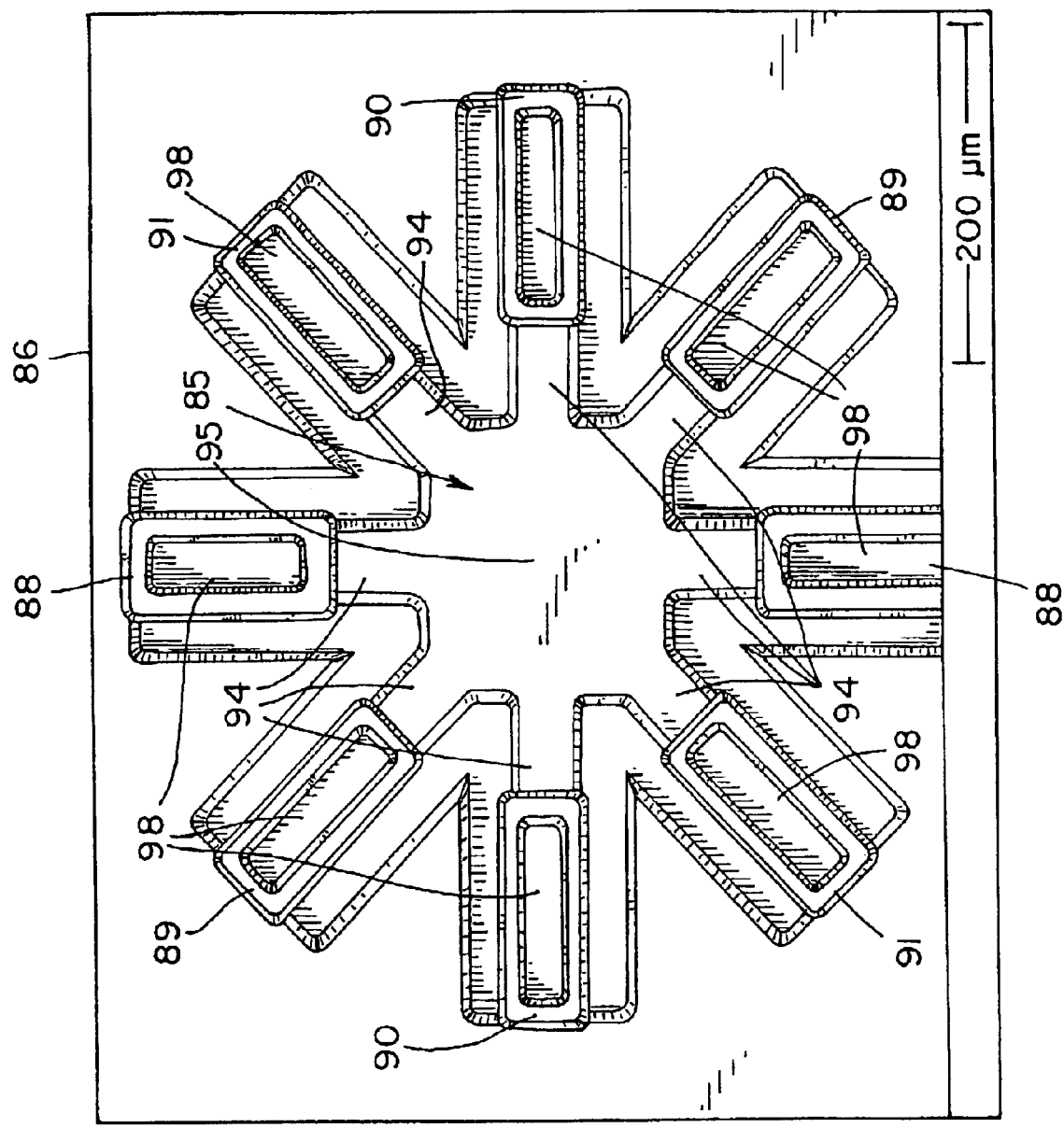
FIG. 18 is a plan view of a semiconductor microstructure having a semiconductor film with arms anchored to the substrate at four pairs of opposed anchor positions.
Figure 19:
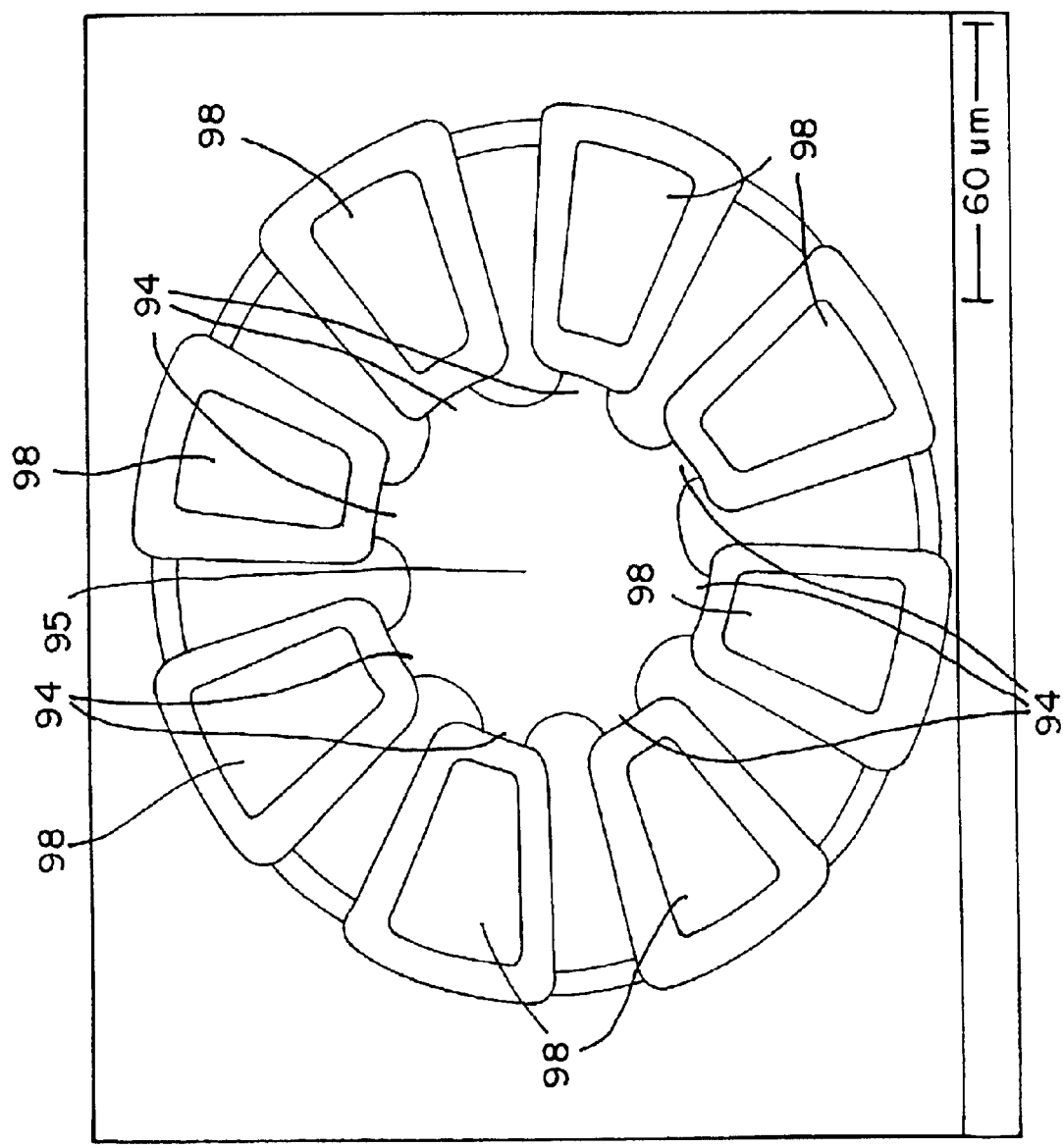
FIG. 19 is a plan view of another semiconductor microstructure with a semiconductor film also having arms anchored to the substrate at four pairs of opposed anchor positions.

The semiconductor film can be anchored to the substrate at more than two positions so that the film can be stressed in more than one direction. FIG. 17 illustrates a semiconductor film 69 formed as a cross with two pairs of arms 70 which are anchored to the substrate 71 at two pairs of anchor positions 72 and 73, which are diagonally oriented with respect to each other. The cross-shaped film 69 is suspended above an opening or depression 75 in the substrate 71. Film segments 76 are deposited on the arms 70, as described above, adjacent to the opposed pairs of anchor positions 72, and film segments 78 are deposited over the arms 70 of the semiconductor film 69 at positions adjacent to the anchor positions 73. The film segments 76 and 78 strain the semiconductor film 69 in diagonally opposed directions so that the center portion 80 of the semiconductor film is stressed in two perpendicular directions. As shown in FIG. 18, a semiconductor film 85 may be anchored to a substrate 86 at four pairs of anchor positions 88, 89, 90, and 91. A series of arms 94 extend away from a center portion 95 of the semiconductor film 85 to be anchored to the substrate at the anchor positions 88–91. Portions of the arms 94 have film segments 98 deposited thereon to stress the arms and thereby provide stress extending in four symmetrically distributed directions to the center portion 95 of the semiconductor film 85. FIG. 19 illustrates a variation on the structure of FIG. 18 in which the film segments 98 essentially entirely cover the arms 94 of the suspended semiconductor film, again providing symmetrical stress to the center portion 95 of the semiconductor film, but with greater stress levels than are imposed with the structure of FIG. 18.

It is understood that the invention is not confined to the particular embodiments set forth herein as illustrative, but embraces all such forms thereof as come within the scope of the following claims.

What is claimed is:

1. A semiconductor microstructure comprising:
   (a) a substrate;
   (b) a semiconductor film anchored to the substrate at a plurality of pairs of opposed anchor positions and suspended between the anchor positions; and
   (c) a film segment of material deposited on the suspended semiconductor film adjacent to each anchor position such that film segments are adjacent to opposed anchor positions and are spaced from each other by a section of the semiconductor film, the film segments having a compressive or tensile strain as deposited on the semiconductor film to apply a compressive or tensile stress to the suspended semiconductor film between the film segments.

2. A semiconductor microstructure comprising:
   (a) a substrate;
   (b) a semiconductor film anchored to the substrate at at least two opposed anchor positions and suspended between the anchor positions; and
   (c) a film segment of material deposited on the suspended semiconductor film adjacent to at least one anchor position, the film segment having a compressive or tensile strain as deposited on the semiconductor film to apply a compressive or tensile stress to the suspended semiconductor film between the film segments, wherein the substrate and semiconductor film are formed of crystalline silicon and the film segments are formed of at least a layer of silicon nitride.

3. A semiconductor microstructure comprising:
   (a) a substrate;
   (b) a semiconductor film anchored to the substrate at at least two opposed anchor positions and suspended between the anchor positions; and (c) a film segment of material deposited on the suspended semiconductor film adjacent to at least one anchor position, the film segment having a compressive or tensile strain as deposited on the semiconductor film to apply a compressive or tensile stress to the suspended semiconductor film between the film segments, wherein the-film segment comprises a layer of silicon dioxide deposited on the semiconductor film and a layer of silicon nitride deposited on the silicon dioxide layer.

4. The microstructure of claim 2 wherein a film segment is deposited on the semiconductor film adjacent to each anchor position such that film segments are adjacent to opposed anchor positions and are spaced from each other by a section of the semiconductor film.

5. The microstructure of claim 4 wherein the semiconductor film is anchored to the substrate at a plurality of pairs of opposed anchor positions.

6. The microstructure of claim 1 wherein the semiconductor film is anchored to the substrate at two opposed pairs of anchor positions.

7. The microstructure of claim 1 wherein the semiconductor film is anchored to the substrate at four opposed pairs of anchor positions.

8. A semiconductor microstructure comprising:
(a) a substrate;
(b) a semiconductor film anchored to the substrate at at least two opposed anchor positions and suspended between the anchor positions;
(c) a film segment of material deposited on the semiconductor film adjacent to at least one anchor position, the film segment having a tensile strain as deposited on the semiconductor film to apply a tensile stress to the suspended semiconductor film adjacent to each anchor position such that film segments are adjacent to opposed anchor positions and are spaced from each other by a section of the semiconductor film, and wherein the semiconductor film is formed of crystalline silicon and the film segments at opposed anchor positions are spaced from each other to define a central portion of the semiconductor film, the film segments are in tensile strain as deposited and apply a tensile stress to the semiconductor film, and including a layer of silicon-germanium deposited on the central portion of the semiconductor film.

9. The microstructure of claim 8 wherein the layer of silicon-germanium has a pattern of quantum dot inclusions of germanium therein with a density related to the level of stress in the central region of the silicon semiconductor film.

10. The microstructure of claim 4 wherein the semiconductor film has a central portion and a plurality of arms extending therefrom to opposed anchor positions at which the arms are anchored to the substrate, a film segment deposited on each arm adjacent the anchor position.

11. A semiconductor microstructure comprising:
(a) a substrate;
(b) a semiconductor film formed of crystalline silicon anchored to the substrate at at least two opposed anchor positions and suspended between the anchor positions;
(c) a film segment of material deposited on the semiconductor film adjacent each anchor position such that the film segments are adjacent to opposed anchor positions and are spaced from each other by a central portion of the semiconductor film, the film segments having a tensile strain as deposited on the semiconductor film to apply a tensile stress to the suspended semiconductor film between the film segments; and
(d) a layer of silicon-germanium deposited on the central portion of the semiconductor film.

12. The microstructure of claim 11 wherein the film segments are formed of at least a layer of silicon nitride.

13. The microstructure of claim 11 wherein the film segments comprise a layer of silicon dioxide deposited on the semiconductor film and a layer of silicon nitride deposited on the silicon dioxide layer.

14. The microstructure of claim 11 wherein the semiconductor film is formed as a beam anchored to the substrate at two opposed positions and is suspended from the substrate between the two opposed anchor positions.

15. The microstructure of claim 11 wherein the semiconductor film is anchored to the substrate at a plurality of pairs of opposed anchor positions.

16. The microstructure of claim 15 wherein the semiconductor film is anchored to the substrate at two opposed pairs of anchor positions.

17. The microstructure of claim 15 wherein the semiconductor film is anchored to the substrate at four opposed pairs of anchor positions.

18. The microstructure of claim 11 wherein the layer of silicon-germanium has a pattern of quantum dot inclusions of germanium therein with a density related to the level of stress in the central region of the silicon semiconductor film.

19. The microstructure of claim 11 wherein the semiconductor film has a plurality of arms extending therefrom to opposed anchor positions at which the arms are anchored to the substrate, a film segment deposited on each arm adjacent the anchor position.

20. The microstructure of claim 11 wherein layer of silicon-germanium is in the ratio $Si_{1-x}Ge_x$ where x is greater than 0.2, and wherein the tensile stress in the semiconductor film is selected such that regions of the silicon-germanium layer are free of quantum dot inclusions.

* * * * *

UNITED STATES PATENT AND TRADEMARK OFFICE
CERTIFICATE OF CORRECTION

PATENT NO. : 6,858,888 B2 Page 1 of 1
DATED : February 22, 2005
INVENTOR(S) : Amit Lal et al.

It is certified that error appears in the above-identified patent and that said Letters Patent is hereby corrected as shown below:

Column 7,
Line 34, -- between the film segments, wherein a film segment is deposited on the semiconductor film -- should be inserted after "suspended semiconductor film".

Signed and Sealed this

Seventh Day of February, 2006

JON W. DUDAS
*Director of the United States Patent and Trademark Office*